(12) United States Patent
Sekiya

(10) Patent No.: US 11,276,588 B2
(45) Date of Patent: Mar. 15, 2022

(54) METHOD OF PROCESSING WAFER

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 45 days.

(21) Appl. No.: 17/070,130

(22) Filed: Oct. 14, 2020

(65) Prior Publication Data

US 2021/0134619 A1 May 6, 2021

(30) Foreign Application Priority Data

Oct. 30, 2019 (JP) .............................. JP2019-197750

(51) Int. Cl.
*H01L 21/67* (2006.01)
*H01L 21/683* (2006.01)
*H01L 21/687* (2006.01)

(52) U.S. Cl.
CPC ...... *H01L 21/67092* (2013.01); *H01L 21/687* (2013.01); *H01L 21/6836* (2013.01)

(58) Field of Classification Search
CPC ................................................ H01L 21/67092
See application file for complete search history.

(56) References Cited

U.S. PATENT DOCUMENTS

2007/0231929 A1* 10/2007 Kajiyama ......... H01L 21/67092
438/6

FOREIGN PATENT DOCUMENTS

| CN | 103367219 A | * 10/2013 | ............. B23K 26/18 |
|---|---|---|---|
| JP | 2007019379 A | 1/2007 | |
| JP | 2007266352 A | 10/2007 | |
| JP | 2008258417 A | 10/2008 | |
| JP | 2011061137 A | 3/2011 | |

* cited by examiner

*Primary Examiner* — Selim U Ahmed
*Assistant Examiner* — Evan G Clinton
(74) *Attorney, Agent, or Firm* — Greer Burns & Crain Ltd.

(57) ABSTRACT

A method of processing a wafer includes a protective member affixing step of affixing a protective member whose area covers a face side or a reverse side of the wafer to the wafer, and after the protective member affixing step has been carried out, a ring-shaped stiffener removing step of removing a ring-shaped stiffener from the wafer. The ring-shaped stiffener removing step includes a ring-shaped stiffener separating step of dividing the wafer along an outer circumference of a device region to separate the device region and the ring-shaped stiffener from each other, and after the ring-shaped stiffener separating step has been carried out, a removing step of processing the ring-shaped stiffener with a grindstone to remove the ring-shaped stiffener from the wafer while a processing fluid is being supplied to the wafer.

5 Claims, 9 Drawing Sheets

METHOD OF PROCESSING WAFER

BACKGROUND OF THE INVENTION

Field of the Invention

The present invention relates to a method of processing a wafer.

Description of the Related Art

Wafers with a plurality of devices such as integrated circuits (ICs) and large-scale integration (LSI) circuits formed on their face side are divided into individual device chips including those devices by a dicing apparatus or the like. For reducing the size and weight of electronic appliances that incorporate such device chips, the reverse side of the wafer to be divided is ground to thin the wafer to a thickness ranging from 20 to 100 µm, for example.

Since a wafer that has been thinned by grinding its reverse side is low in rigidity and tends to warp to a large extent, the wafer is difficult to handle and deliver in subsequent steps for coating the reverse side of the wafer with a metal film of gold, silver, titanium, or the like to a thickness of several tens nm, and forming via holes in electrodes of the devices. One solution that has addressed the above problem is a wafer processing method known as TAIKO (registered trademark) grinding by which only the reverse side of a wafer's device region is ground thin, leaving a wafer's outer circumferential edge portion unground as a ring-shaped stiffener that is thicker than the wafer's device region. The wafer processing method has made it possible to suppress thin wafers from warping and deliver them with ease. In a dividing step of dividing a wafer processed by the TAIKO grinding into device chips, the wafer's outer circumferential edge portion left as the ring-shaped stiffener is unnecessary. There have been devised wafer processing methods and apparatuses for cutting a TAIKO-ground wafer annularly along a radially inner portion of the ring-shaped stiffener, cutting off and removing the ring-shaped stiffener.

SUMMARY OF THE INVENTION

However, inasmuch as an extremely delicate operation is required to cut off and remove the ring-shaped stiffener, which is less than 1 mm thick though thicker than the rest of the wafer, from a dicing tape, it is time-consuming to remove the ring-shaped stiffener, and the ring-shaped stiffener may accidentally be broken, tending to damage some of the devices. It has also been proposed to remove the ring-shaped stiffener in its entirety or projecting portions thereof by cutting the ring-shaped stiffener or its projecting portions with a cutting blade or grinding the ring-shaped stiffener or its projecting portions with a grinding wheel. The proposal, however, is conducive to the development of chipping or cracking in the wafer's device region under loads imposed by the process of removing the ring-shaped stiffener.

It is therefore an object of the present invention to provide a method of processing a wafer to remove a rink-shaped stiffener without imposing processing loads on a wafer's device region.

In accordance with an aspect of the present invention, there is provided a method of processing a wafer having on a face side thereof a device region in which a plurality of devices are formed in respective areas demarcated by a plurality of intersecting streets and an outer circumferential excess region surrounding the device region, the wafer further including a circular recess defined by grinding in a reverse side of the wafer and corresponding to the device region and a ring-shaped stiffener along an outer circumference of the circular recess. The method includes a protective member affixing step of affixing a protective member whose area covers the face side or the reverse side of the wafer to the wafer, and after the protective member affixing step has been carried out, a ring-shaped stiffener removing step of removing the ring-shaped stiffener from the wafer. The ring-shaped stiffener removing step includes a ring-shaped stiffener separating step of dividing the wafer along an outer circumference of the device region to separate the device region and the ring-shaped stiffener from each other, and after the ring-shaped stiffener separating step has been carried out, a removing step of processing the ring-shaped stiffener with a grindstone to remove the ring-shaped stiffener from the wafer while a processing fluid is being supplied to the wafer.

Preferably, the removing step includes a step of grinding off the ring-shaped stiffener with a grinding wheel mounted on a lower end of a spindle having a rotational axis perpendicular to a holding surface of a chuck table that holds the wafer thereon.

Preferably, the removing step includes a step of cutting off the ring-shaped stiffener with a cutting blade mounted on a distal end of a spindle having a rotational axis parallel to a holding surface of a chuck table that holds the wafer thereon.

Preferably, the ring-shaped stiffener separating step is carried out using a cutting blade or a laser beam.

Preferably, the protective member affixing step includes a step of affixing an outer circumferential edge of the protective member that covers the face side or the reverse side of the wafer to an annular frame, forming a frame unit in which the wafer is affixed to the protective member in an opening of the annular frame.

According to the present invention, the ring-shaped stiffener can be removed from the wafer without imposing processing loads on the device region.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Preferred embodiments of the present invention will hereinafter be described in detail below with reference to the drawings. The present invention is not limited to the details of the embodiments described below. The components described below cover those which could easily be envisaged by those skilled in the art and those which are essentially identical to those described above. Furthermore, the arrangements described below can be used in appropriate combinations. Various omissions, replacements, or changes of the arrangements may be made without departing from the scope of the present invention.

Figure 1:
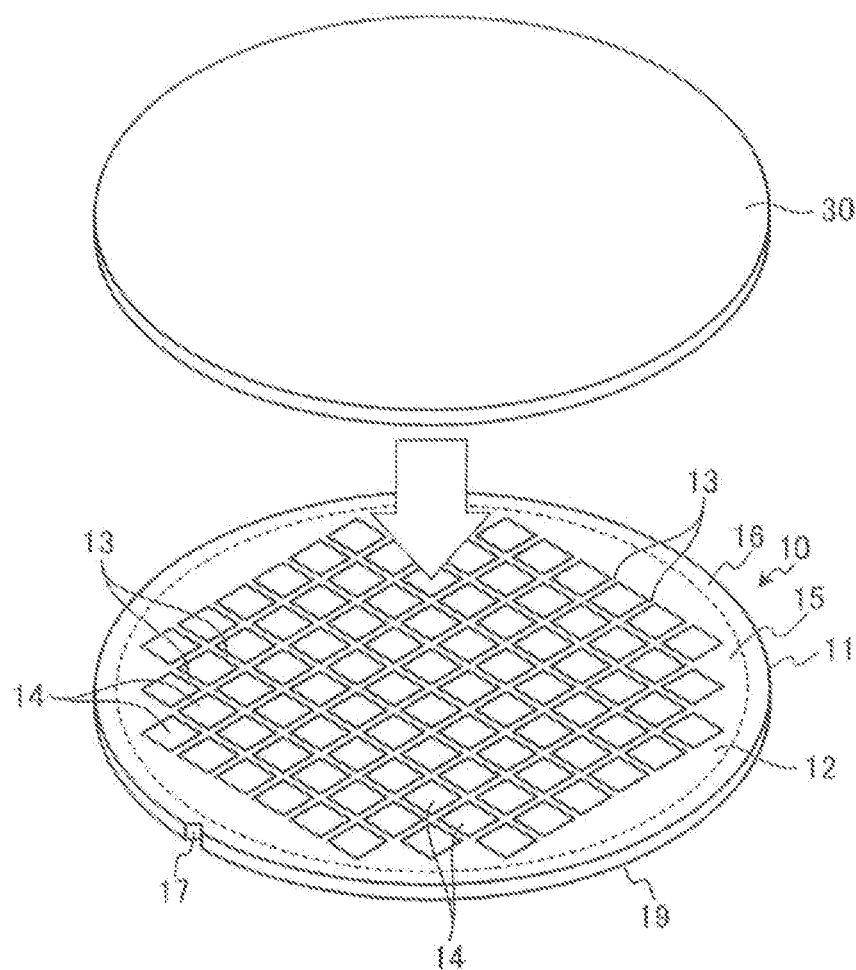
FIG. 1 is a perspective view illustrating by way of example a wafer as a target to be processed by a method of processing a wafer according to an embodiment of the present invention.
Figure 2:
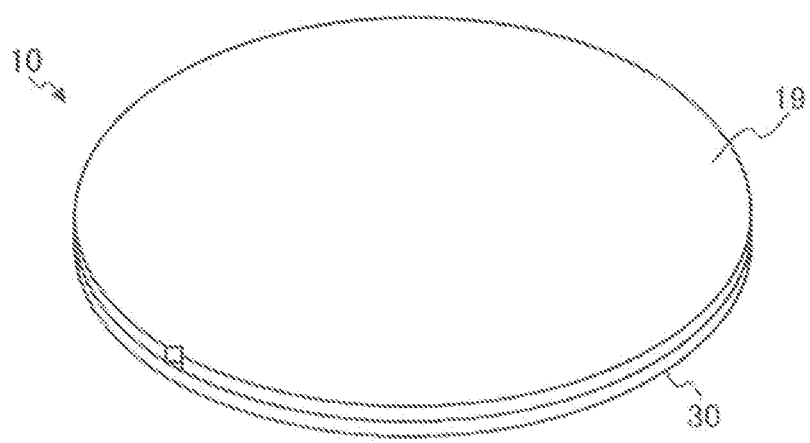
FIG. 2 is a perspective view of a reverse side of the wafer illustrated in FIG. 1.

A method of processing a wafer according to an embodiment of the present invention will be described below with reference to the drawings. First, a structure of a wafer as a target to be processed according to the embodiment will be described below. FIG. 1 illustrates in perspective by way of example the wafer, denoted by 10, as the target to be processed by the method of processing a wafer according to the embodiment. FIG. 2 illustrates in perspective a reverse side 19 of the wafer 10 illustrated in FIG. 1.

As illustrated in FIG. 1, the wafer 10 refers to a wafer such as a semiconductor wafer or an optical device wafer that is shaped as a circular plate including a substrate 11 of silicon (Si), sapphire ($Al_2O_3$), gallium arsenide (GaAs), silicon carbide (SiC), or the like. The wafer 10 has a grid of intersecting streets or projected dicing lines 13 on a face side 12 of the substrate 11 and a plurality of devices 14 formed in respective areas demarcated on the face side 12 by the streets 13.

The face side 12 of the wafer 10 includes a device region 15 and an outer circumferential excess region 16. The device region 15 refers to a region where the devices 14 are formed and the streets 13 are established. The device region 15 is positioned centrally on the substrate 11. The outer circumferential excess region 16 refers to a region where the devices 14 are not formed and the streets 13 are not established. The outer circumferential excess region 16 surrounds the device region 15. In FIG. 1, a boundary between the device region 15 and the outer circumferential excess region 16 is represented by a dotted line for illustrative purpose. Actually, there is no line at the boundary between the device region 15 and the outer circumferential excess region 16. The wafer 10 has a notch 17 defined in an outer circumferential edge thereof as indicating a crystal orientation of the wafer 10. The wafer 10 will be divided along the streets 13 into a plurality of device chips. As illustrated in FIG. 2, the reverse side 19 of the wafer 10 is positioned opposite the face side 12 where the devices 14 are formed.

Figure 3:
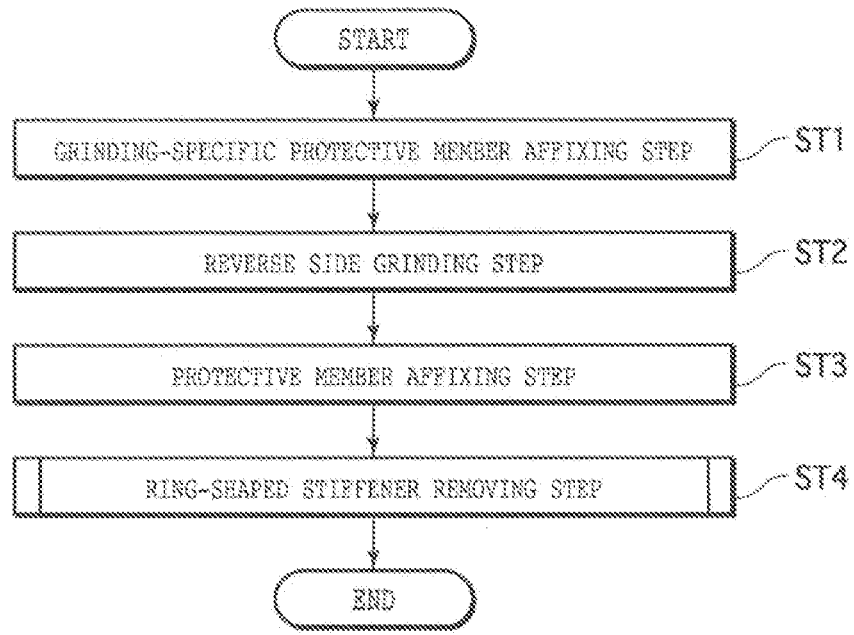
FIG. 3 is a flowchart of a sequence of the method of processing a wafer according to the embodiment.
Figure 4:
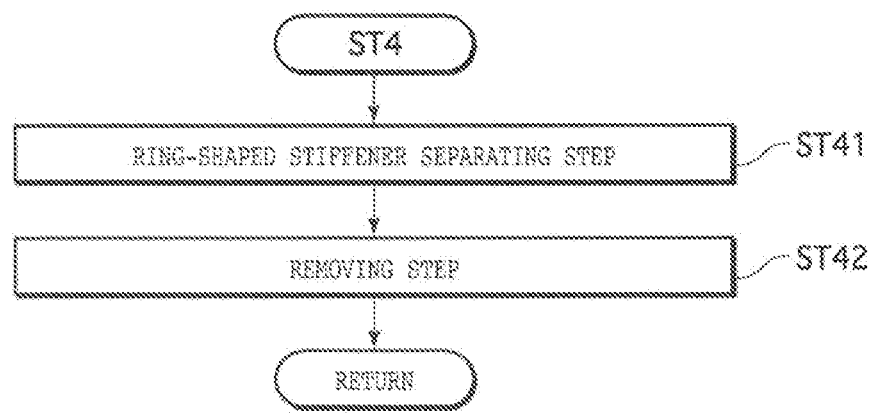
FIG. 4 is a flowchart of a sequence of a ring-shaped stiffener removing step illustrated in FIG. 3.

Next, the method of processing the wafer 10 according to the present embodiment will be described below. FIG. 3 is a flowchart of a sequence of the method of processing the wafer 10 according to the present embodiment. FIG. 4 is a flowchart of a sequence of a ring-shaped stiffener removing step ST4 illustrated in FIG. 3. As illustrated in FIG. 3, the method of processing the wafer 10 includes a grinding-specific protective member affixing step ST1, a reverse side grinding step ST2, a protective member affixing step ST3, and the ring-shaped stiffener removing step ST4. As illustrated in FIG. 4, the ring-shaped stiffener removing step ST4 includes a ring-shaped stiffener separating step ST41 and a removing step ST42. The method of processing the wafer 10 also includes a step of coating the reverse side 19 with a metal film of gold, silver, titanium, or the like or a step of forming via holes in electrodes of the devices 14, for example, between the reverse side grinding step ST2 and the protective member affixing step ST3. The method of processing the wafer 10 further includes a dividing step of dividing the wafer 10 along the streets 13 into device chips after the ring-shaped stiffener removing step ST4.

Figure 5:
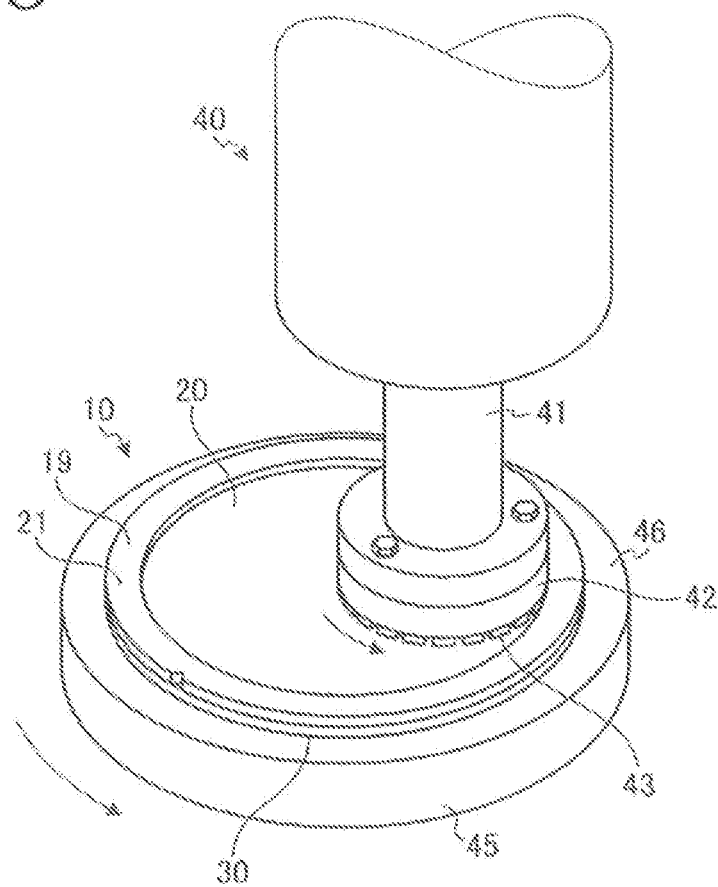
FIG. 5 is a perspective view illustrating by way of example a reverse side grinding step illustrated in FIG. 3.

The grinding-specific protective member affixing step ST1 is a step of, as illustrated in FIGS. 1 and 2, affixing a grinding-specific protective member 30 to the face side 12 of the wafer 10 before the reverse side 19 of the wafer 10 is ground by a grinding unit 40 (see FIG. 5). The grinding-specific protective member 30 protects the devices 14 on the face side 12 of the wafer 10 held on a chuck table 45 (see FIG. 5) from deposition of foreign matters and damages due to contact when the reverse side 19 of the wafer 10 is ground by the grinding unit 40. According to the present embodiment, the grinding-specific protective member 30 is in the form of a tape as a circular plate that is identical in shape to the wafer 10. The grinding-specific protective member 30 includes, for example, a base layer made of a synthetic resin and an adhesive glue layer layered on at least either one of face and reverse sides of the base layer.

Figure 6:
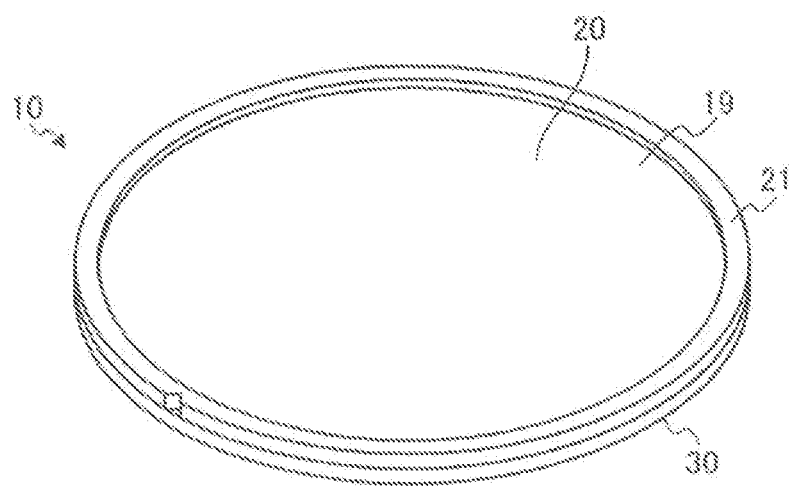
FIG. 6 is a perspective view illustrating a reverse side of a wafer with a ring-shaped stiffener formed thereon after the reverse side grinding step illustrated in FIG. 5.

FIG. 5 illustrates in perspective by way of example the reverse side grinding step ST2 illustrated in FIG. 3. FIG. 6 illustrates in perspective the reverse side 19 of the wafer 10 with a ring-shaped stiffener 21 formed thereon after the reverse side grinding step ST2 illustrated in FIG. 5. As illustrated in FIGS. 5 and 6, the reverse side grinding step ST2 is a step of grinding a region of the reverse side 19 of the wafer 10 that corresponds to the device region 15 to a predetermined thickness, forming a recess 20 in the reverse side 19 and also forming the ring-shaped stiffener 21 along an outer circumference of the recess 20. In other words, the reverse side grinding step ST2 is a step of TAIKO (registered trademark)-grinding the wafer 10 from the reverse side 19. According to the present invention, the region of the reverse side 19 of the wafer 10 that corresponds to the device region 15 refers to a region of the reverse side 19 of the wafer 10 that overlaps the device region 15 on the face side 12 in a thicknesswise direction of the wafer 10.

In the reverse side grindings step ST2, the grinding unit 40 grinds the region of the reverse side 19 of the wafer 10 that corresponds to the device region 15. The grinding unit 40 includes a spindle 41 as a rotational shaft, a grinding wheel 42 attached to a lower end of the spindle 41, grindstones 43 mounted on a lower surface of the grinding wheel 42, and a rotatable chuck table 45. The spindle 41 and the grinding wheel 42 have a rotational axis perpendicular to a holding surface 46 of the chuck table 45 that holds the wafer 10 as a target to be ground, i.e., parallel to a central axis of the chuck table 45.

First, in the reverse side grinding step ST2, as illustrated in FIG. 5, the face side 12 of the wafer 10 is held under suction on the holding surface 46 of the chuck table 45 of the grinding unit 40 with the grinding-specific protective member 30 interposed between the wafer 10 and the holding surface 46. Then, while the chuck table 45 is being rotated about its central axis, the grinding wheel 42 is rotated about its own central axis by the spindle 41. Next, while a processing fluid is being supplied to the reverse side 19 of the wafer 10 and the grindstones 43, the grinding wheel 42 is lowered to bring the rotating grindstones 43 into contact with the reverse side 19 of the wafer 10 on the rotating chuck table 45. At this time, a control apparatus of the grinding unit 40 or an operator thereof controls the grindstones 43 to keep contacting the central axis, i.e., the center of rotation, of the reverse side 19 of the wafer 10 and also to stay out of contact with a region of the reverse side 19 that corresponds to the outer circumferential excess region 16 of the face side 12 of the wafer 10. Therefore, only the region of the reverse side 19 of the wafer 10 that corresponds to the device region 15 is ground, forming the recess 20 in the reverse side 19 and leaving the region of the reverse side 19 that corresponds to the outer circumferential excess region 16 of the face side 12 unground as the ring-shaped stiffener 21 that is of the same thickness as the wafer 10 before the reverse side grinding step ST2.

By being ground to form the recess 20, the region of the reverse side 19 of the wafer 10 that corresponds to the device region 15 is thinned to a thickness ranging from approximately 20 to 100 μm, for example. The thickness of the ring-shaped stiffener 21 is the same as the thickness of the wafer 10 prior to the reverse side grinding step ST2, and ranges from approximately 0.5 to 1 mm, for example. The ring-shaped stiffener 21 has a width ranging from approximately 2 to 8 mm, for example. Since the ring-shaped stiffener 21 is effective to restrain the wafer 10 from warping, the ring-shaped stiffener 21 assists in handling and delivering the wafer 10 in steps before the wafer 10 is divided into device chips. After the reverse side grinding step ST2, the grinding-specific protective member 30 is peeled off from the wafer 10 by a known method, and the step of coating the reverse side 19 with a metal film of gold, silver, titanium, or the like or the step of forming via holes in electrodes of the devices 14 is carried out.

The protective member affixing step ST3 according to the present embodiment will be described below. The protective member affixing step ST3 is a step of affixing a protective member 31 whose area covers the face side 12 or the reverse side 19 of the wafer 10 to the wafer 10. According to the present embodiment, in the protective member affixing step ST3, an outer circumferential edge of the protective member 31 that covers the face side 12 or the reverse side 19 of the wafer 10 is affixed to an annular frame 32, forming a frame unit 1 or 1-2 in which the wafer 10 is supported on the protective member 31 in an opening of the annular frame 32. First and second examples of the protective member affixing step ST3 will be described below.

Figure 7:
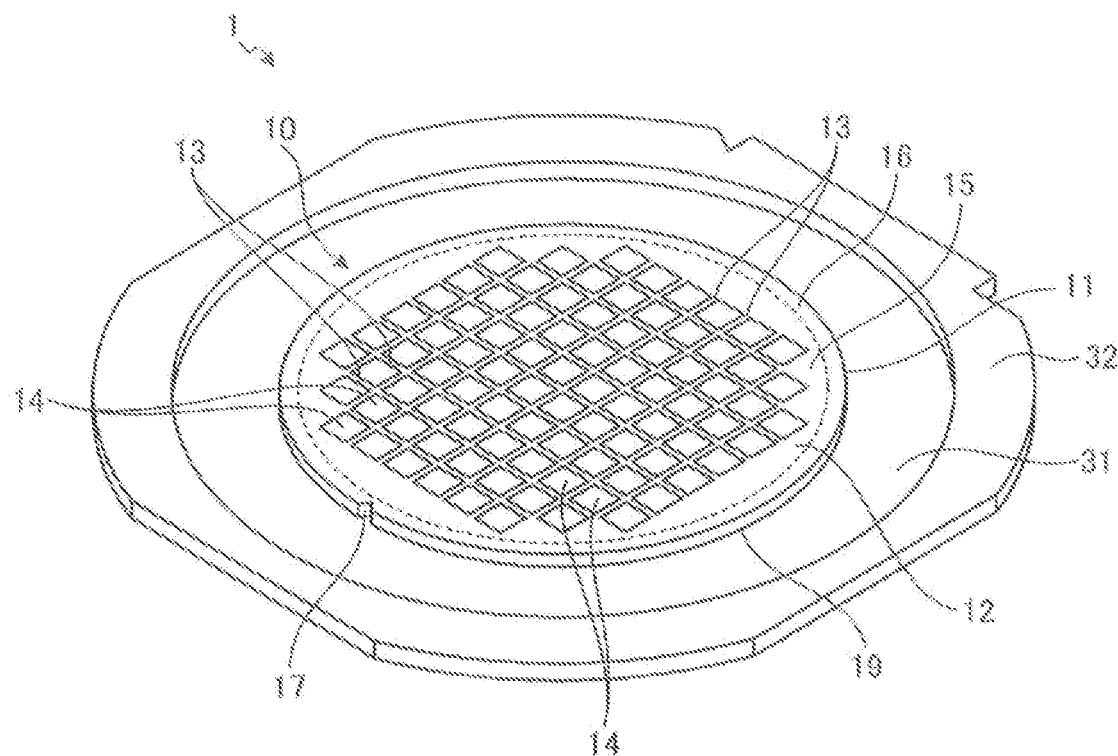
FIG. 7 is a perspective view illustrating a first example of a frame unit after a protective member affixing step illustrated in FIG. 3.
Figure 8:
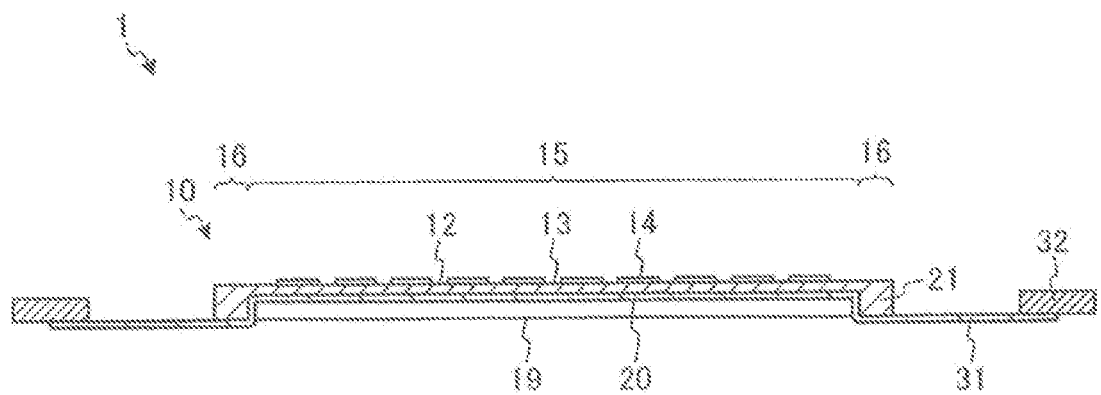
FIG. 8 is a cross-sectional view of the first example of the frame unit illustrated in FIG. 7.

FIG. 7 illustrates in perspective a first example of the frame unit 1 after the protective member affixing step ST3 illustrated in FIG. 3. FIG. 8 illustrates in cross section the first example of the frame unit 1 illustrated in FIG. 7. In the first example of the protective member affixing step ST3 illustrated in FIGS. 7 and 8, the protective member 31 is affixed to the reverse side 19 of the wafer 10.

The protective member 31 includes a base layer made of an elastic synthetic resin and a glue layer made of an elastic and adhesive synthetic resin and layered on at least either one of face and reverse sides of the base layer. The protective member 31 has an outer circumferential edge affixed to a reverse side of the annular frame 32. A diameter of the opening of the annular frame 32 is larger than a diameter of the wafer 10.

In the first example of the protective member affixing step ST3, the wafer 10 is positioned at a predetermined position on the protective member 31 in the opening of the annular frame 32, and the reverse side 19 of the wafer 10 is affixed to the glue layer of the protective member 31, so that the wafer 10 is fixed to the protective member 31 and the annular frame 32. At this time, the protective member 31 is affixed to the reverse side 19 and an inner wall surface of the ring-shaped stiffener 21 and a bottom surface of the recess 20 along a shape of the recess 20 defined in the reverse side 19 of the wafer 10. In the first example of the protective member affixing step ST3, the wafer 10 including the ring-shaped stiffener 21, the protective member 31 affixed to the reverse side 19 of the wafer 10, and the annular frame 32 to which the outer circumference of the protective member 31 is affixed jointly make up the frame unit 1.

Figure 9:
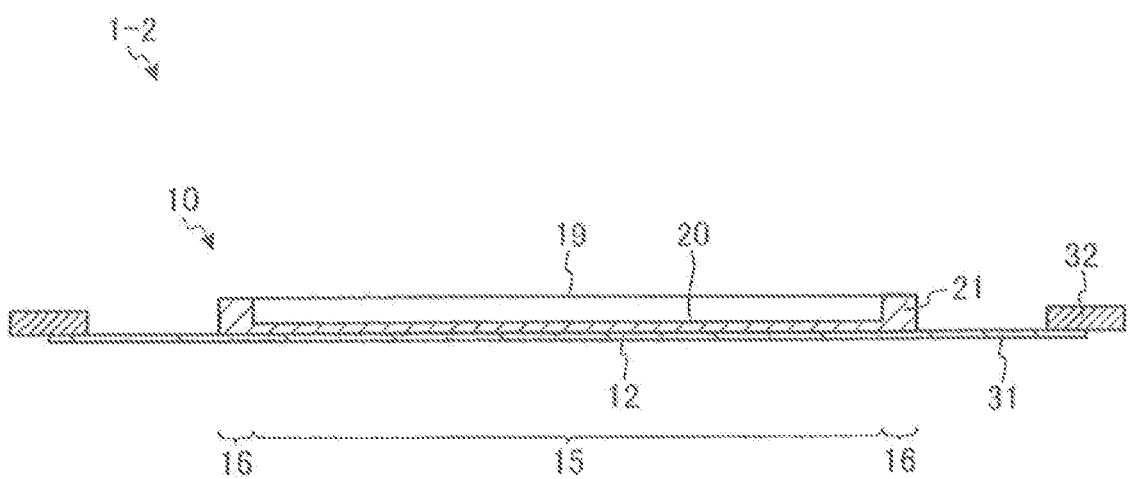
FIG. 9 is a cross-sectional view illustrating a second example of the frame unit after the protective member affixing step illustrated in FIG. 3.

FIG. 9 illustrates in cross section a second example of the frame unit 1-2 after the protective member affixing step ST3 illustrated in FIG. 3. In the second example of the protective member affixing step ST3 illustrated in FIG. 9, the protective member 31 is affixed to the face side 12 of the wafer 10.

In the second example of the protective member affixing step ST3, the wafer 10 is positioned at a predetermined position in the opening of the annular frame 32, and the face side 12 of the wafer 10 is affixed to the face side of the protective member 31, so that the wafer 10 is fixed to the protective member 31 and the annular frame 32. In the second example of the protective member affixing step ST3, the wafer 10 including the ring-shaped stiffener 21, the protective member 31 affixed to the face side 12 of the wafer 10, and the annular frame 32 to which the outer circumference of the protective member 31 is affixed jointly make up the frame unit 1-2.

Next, the ring-shaped stiffener removing step ST4 will be described below. The ring-shaped stiffener removing step ST4 is a step of removing the ring-shaped stiffener 21 from the wafer 10 after the protective member affixing step ST3 has been carried out. As described above, the ring-shaped stiffener removing step ST4 includes the ring-shaped stiffener separating step ST41 and the removing step ST42.

First, the ring-shaped stiffener separating step ST41 according to the present embodiment will be described below. The ring-shaped stiffener separating step ST41 is a step of dividing the wafer 10 along the outer circumference of the device region 15 to separate the device region 15 and the ring-shaped stiffener 21 from each other. First, second, third, and fourth examples of the ring-shaped stiffener separating step ST41 will be described below.

Figure 10:
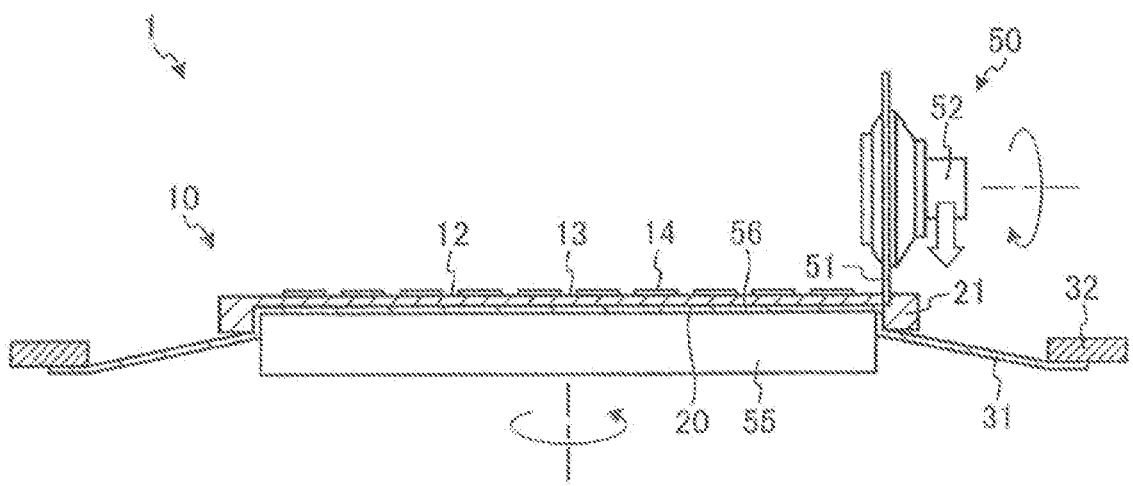
FIG. 10 is a side elevational view, partly in cross section, illustrating a first example of a ring-shaped stiffener separating step illustrated in FIG. 4.

FIG. 10 illustrates in side elevation, partly in cross section, the first example of the ring-shaped stiffener separating step ST41 illustrated in FIG. 4. The first example of the ring-shaped stiffener separating step ST41 illustrated in FIG. 10 is carried out after the first example of the protective member affixing step ST3. In other words, the first example of the ring-shaped stiffener separating step ST41 is carried out while the protective member 31 is being affixed to the reverse side 19 of the wafer 10.

In the first example of the ring-shaped stiffener separating step ST41, a cutting unit 50 separates the device region 15 and the ring-shaped stiffener 21 from each other. The cutting unit 50 includes a cutting blade 51 shaped as a circular plate and a spindle 52 as a rotational shaft of the cutting blade 51. The cutting blade 51 has a cutting edge thickness ranging from 0.03 to 0.3 mm, for example. The cutting blade 51 and the spindle 52 have a rotational axis parallel to a holding surface 56 of a chuck table 55 that holds the wafer 10 as a target to be cut. The cutting blade 51 is mounted on a distal end of the spindle 52.

In the first example of the ring-shaped stiffener separating step ST41, as illustrated in FIG. 10, the reverse side 19 of the wafer 10 is held under suction on the holding surface 56 of the chuck table 55 with the protective member 31 interposed between the reverse side 19 and the holding surface 56. In the first example of the ring-shaped stiffener separating step ST41, the chuck table 55 is fitted in the recess 20 of the wafer 10. At this time, the annular frame 32 that is pressed downwardly below the reverse side 19 of the wafer 10 is secured in place by clamps or the like, not illustrated, fixing the bottom surface of the recess 20 of the wafer 10 to the holding surface 56 of the chuck table 55.

In the first example of the ring-shaped stiffener separating step ST41, next, the cutting blade 50 and the wafer 10 are positioned with respect to each other. Specifically, the cutting blade 51 has its processing point positioned above an area between a device 14 on an outermost circumference and the ring-shaped stiffener 21, slightly inward of a boundary between the recess 20 of the wafer 10 and the ring-shaped stiffener 21.

In the first example of the ring-shaped stiffener separating step ST41, then, the spindle 52 rotates the cutting blade 51 about its central axis. In the first example of the ring-shaped stiffener separating step ST41, next, while a processing fluid is being supplied to the face side 12 of the wafer 10 and the cutting blade 51, the spindle 52 is lowered to cause the rotating cutting blade 51 to cut into the wafer 10 on the chuck table 55 from the face side 12, and thereafter the chuck table 55 is rotated about its central axis, rotating the wafer 10 therewith. When the cutting blade 51 reaches the bottom surface of the recess 20 of the wafer 10 while the wafer 10 is rotating about its central axis, the cutting blade 51 cuts the wafer 10 along its full circumference, separating the device region 15 and the ring-shaped stiffener 21 from each other and forming an annular cut groove therebetween in the wafer 10. Since the protective member 31 is affixed to the wafer 10, the device region 15 and the ring-shaped stiffener 21 that have been separated from each other remain supported on the protective member 31.

Figure 11:
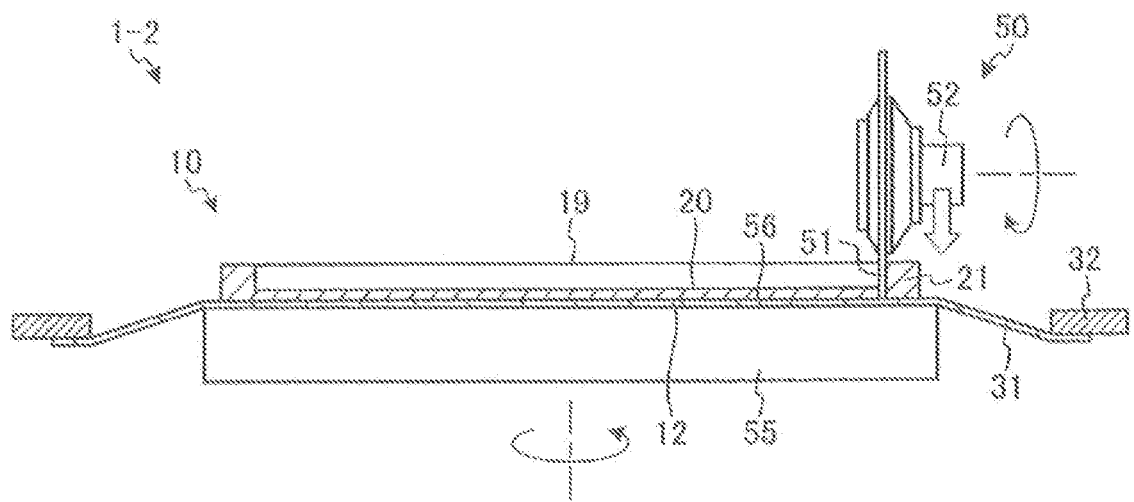
FIG. 11 is a side elevational view, partly in cross section, illustrating a second example of the ring-shaped stiffener separating step illustrated in FIG. 4.

FIG. 11 illustrates in side elevation, partly in cross section, the second example of the ring-shaped stiffener separating step ST41 illustrated in FIG. 4. The second example of the ring-shaped stiffener separating step ST41 illustrated in FIG. 11 is carried out after the second example of the protective member affixing step ST3. In other words, the second example of the ring-shaped stiffener separating step ST41 is carried out while the protective member 31 is being affixed to the face side 12 of the wafer 10.

In the second example of the ring-shaped stiffener separating step ST41, the cutting unit 50 separates the device region 15 and the ring-shaped stiffener 21 from each other, as with the first example of the ring-shaped stiffener separating step ST41. In the second example of the ring-shaped stiffener separating step ST41, as illustrated in FIG. 11, the face side 12 of the wafer 10 is held under suction on the holding surface 56 of the chuck table 55 with the protective member 31 interposed between the face side 12 and the holding surface 56. At this time, the annular frame 32 that is pressed downwardly below the face side 12 of the wafer 10 is secured in place by clamps or the like, not illustrated, fixing the face side 12 of the wafer 10 to the holding surface 56 of the chuck table 55.

In the second example of the ring-shaped stiffener separating step ST41, next, the cutting blade 50 and the wafer 10 are positioned with respect to each other. Specifically, the cutting blade 51 has its processing point positioned above an area between a device 14 on the outermost circumference and the ring-shaped stiffener 21, slightly inward of the boundary between the recess 20 of the wafer 10 and the ring-shaped stiffener 21.

In the second example of the ring-shaped stiffener separating step ST41, then, the spindle 52 rotates the cutting blade 51 about its central axis. In the second example of the ring-shaped stiffener separating step ST41, next, while a processing fluid is being supplied to the reverse side 19 of the wafer 10 and the cutting blade 51, the spindle 52 is lowered to cause the rotating cutting blade 51 to cut into the wafer 10 on the chuck table 55 from the bottom surface of the recess 20, and thereafter the chuck table 55 is rotated about its central axis, rotating the wafer 10 therewith. When the cutting blade 51 reaches the face side 12 of the wafer 10 while the wafer 10 is rotating about its central axis, the cutting blade 51 cuts the wafer 10 along its full circumference, separating the device region 15 and the ring-shaped stiffener 21 from each other and forming an annular cut groove therebetween in the wafer 10. Since the protective member 31 is affixed to the wafer 10, the device region 15 and the ring-shaped stiffener 21 that have been separated from each other remain supported on the protective member 31.

Figure 12:
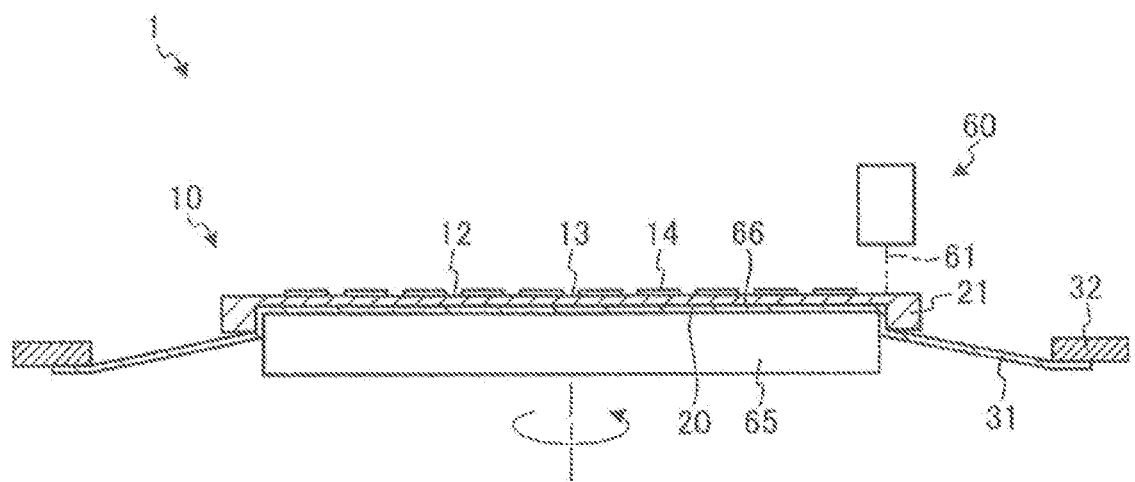
FIG. 12 is a side elevational view, partly in cross section, illustrating a third example of the ring-shaped stiffener separating step illustrated in FIG. 4.

FIG. 12 illustrates in side elevation, partly in cross section, the third example of the ring-shaped stiffener separating step ST41 illustrated in FIG. 4. The third example of the ring-shaped stiffener separating step ST41 illustrated in FIG. 12 is carried out after the first example of the protective member affixing step ST3. In other words, the third example of the ring-shaped stiffener separating step ST41 is carried out while the protective member 31 is being affixed to the reverse side 19 of the wafer 10.

In the third example of the ring-shaped stiffener separating step ST41, a laser beam applying unit 60 separates the device region 15 and the ring-shaped stiffener 21 from each other. The laser beam applying unit 60 is a unit for applying a laser beam 61 having a wavelength absorbable by the wafer 10 held on a chuck table 65. The laser beam applying unit 60 includes a laser beam oscillator, a mirror, and a converging lens, for example. The laser beam oscillator emits the laser beam 61 for processing the wafer 10. The mirror reflects the laser beam 61 emitted from the laser beam oscillator toward the wafer 10 held on a holding surface 66 of the chuck table 65. The converging lens focuses the laser beam 61 reflected from the mirror onto the wafer 10.

In the third example of the ring-shaped stiffener separating step ST41, as illustrated in FIG. 12, the reverse side 19 of the wafer 10 is held under suction on the holding surface 66 of the chuck table 65 with the protective member 31 interposed between the reverse side 19 and the holding surface 66. In the third example of the ring-shaped stiffener separating step ST41, the chuck table 65 is fitted in the recess 20 of the wafer 10. At this time, the annular frame 32 that is pressed downwardly below the reverse side 19 of the wafer 10 is secured in place by clamps or the like, not illustrated, fixing the bottom surface of the recess 20 of the wafer 10 to the holding surface 66 of the chuck table 65.

In the third example of the ring-shaped stiffener separating step ST41, next, the laser beam applying unit 60 and the wafer 10 are positioned with respect to each other. Specifically, the laser beam 61 has its focused spot positioned above an area between a device 14 on the outermost circumference and the ring-shaped stiffener 21, slightly inward of the boundary between the recess 20 of the wafer 10 and the ring-shaped stiffener 21.

In the third example of the ring-shaped stiffener separating step ST41, then, while the chuck table 65 is being rotated about its central axis, the focused spot of the laser beam 61 is placed on the face side 12 of the wafer 10 or inside of the wafer 10, and the laser beam 61 performs an ablation process on the wafer 10 to form an annular laser-processed groove in the wafer 10, separating the device region 15 and the ring-shaped stiffener 21 from each other. Since the protective member 31 is affixed to the wafer 10, the device region 15 and the ring-shaped stiffener 21 that have been separated from each other remain supported on the protective member 31.

Figure 13:
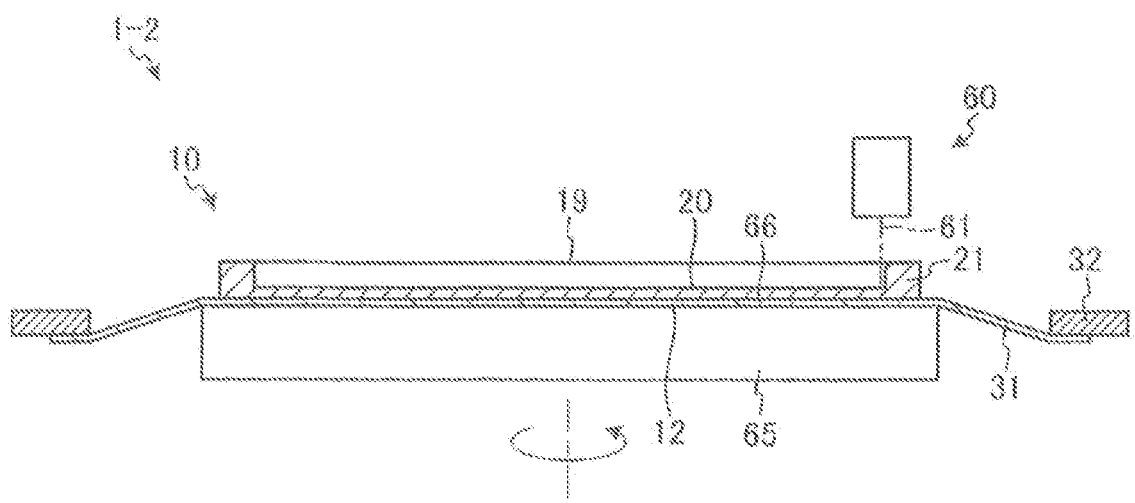
FIG. 13 is a side elevational view, partly in cross section, illustrating a fourth example of the ring-shaped stiffener separating step illustrated in FIG. 4.

FIG. 13 illustrates in side elevation, partly in cross section, the fourth example of the ring-shaped stiffener separating step ST41 illustrated in FIG. 4. The fourth example of the ring-shaped stiffener separating step ST41 illustrated in FIG. 13 is carried out after the second example of the protective member affixing step ST3. In other words, the fourth example of the ring-shaped stiffener separating step ST41 is carried out while the protective member 31 is being affixed to the face side 12 of the wafer 10.

In the fourth example of the ring-shaped stiffener separating step ST41, the laser beam applying unit 60 separates the device region 15 and the ring-shaped stiffener 21 from each other, as with the third example of the ring-shaped stiffener separating step ST41. In the fourth example of the ring-shaped stiffener separating step ST41, as illustrated in FIG. 13, the face side 12 of the wafer 10 is held under suction on the holding surface 66 of the chuck table 65 with the protective member 31 interposed between the face side 12 and the holding surface 66. At this time, the annular frame 32 that is pressed downwardly below the face side 12 of the wafer 10 is secured in place by clamps or the like, not illustrated, fixing the face side 12 of the wafer 10 to the holding surface 66 of the chuck table 65.

In the fourth example of the ring-shaped stiffener separating step ST41, next, the laser beam applying unit 60 and the wafer 10 are positioned with respect to each other. Specifically, the laser beam 61 has its focused spot positioned above an area between a device 14 on the outermost circumference and the ring-shaped stiffener 21, slightly inward of the boundary between the recess 20 of the wafer 10 and the ring-shaped stiffener 21.

In the fourth example of the ring-shaped stiffener separating step ST41, then, while the chuck table 65 is being rotated about its central axis, the focused spot of the laser beam 61 is placed on the bottom surface of the recess 20 of the wafer 10 or inside of the wafer 10, and the laser beam 61 performs an ablation process on the wafer 10 to form an annular laser-processed groove in the wafer 10, separating the device region 15 and the ring-shaped stiffener 21 from each other. Since the protective member 31 is affixed to the wafer 10, the device region 15 and the ring-shaped stiffener 21 that have been separated from each other remain supported on the protective member 31.

In the third and fourth examples of the ring-shaped stiffener separating step ST41, the laser beam 61 may have a wavelength that is transmittable through the wafer 10. In this case, in the third and fourth examples of the ring-shaped stiffener separating step ST41, the laser beam 61 applied to the wafer 10 forms annular modified layers in the wafer 10, and the device region 15 and the ring-shaped stiffener 21 are separated from each other from the annular modified layers and cracks developed from the annular modified layers.

Next, the removing step ST42 according to the present embodiment will be described below. The removing step ST42 is a step of grinding off the ring-shaped stiffener 21 while a processing fluid is being supplied to the wafer 10 after the ring-shaped stiffener separating step ST41 has been carried out. First, second, third, fourth, and fifth examples of the removing step ST42 will be described below.

Figure 14:
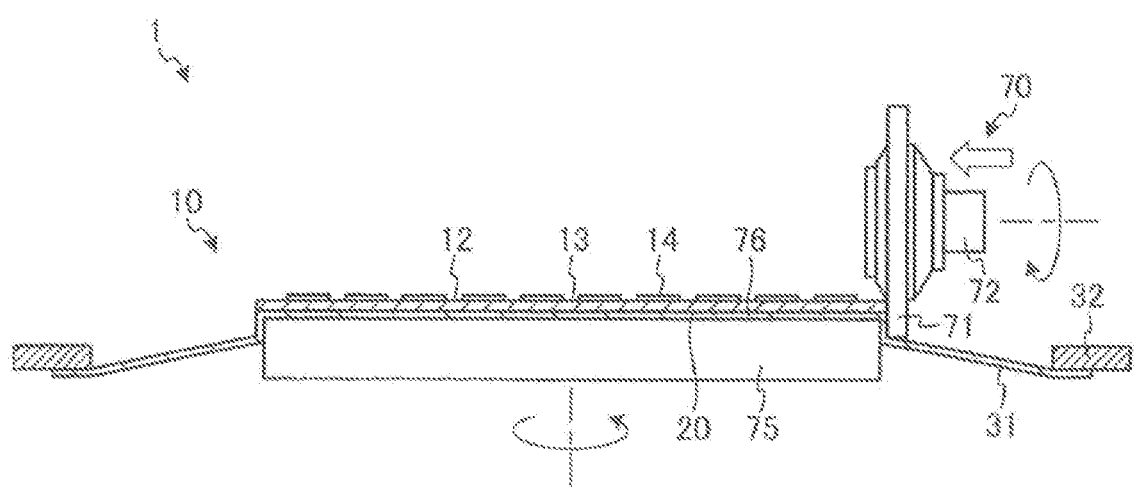
FIG. 14 is a side elevational view, partly in cross section, illustrating a first example of a removing step illustrated in FIG. 4.

FIG. 14 illustrates in side elevation, partly in cross section, the first example of the removing step ST42 illustrated in FIG. 4. The first example of the removing step ST42 illustrated in FIG. 14 is carried out after the first or third example of the ring-shaped stiffener separating step ST41. In other words, the first example of the removing step ST42 is carried out while the protective member 31 is being affixed to the reverse side 19 of the wafer 10.

In the first example of the removing step ST42, a cutting unit 70 grinds off the ring-shaped stiffener 21 that has been separated from the device region 15. The cutting unit 70 includes a cutting blade 71 shaped as a circular plate and a spindle 72 as a rotational shaft of the cutting blade 71. The cutting blade 71 has a cutting edge thickness ranging from 1 to 5 mm, for example. Stated otherwise, the cutting blade 71 used in the first example of the removing step ST42 has its cutting edge thickness larger than the cutting edge thickness of the cutting blade 51 of the cutting unit 50 used in the first or second example of the ring-shaped stiffener separating step ST41. The cutting blade 71 and the spindle 72 have a rotational axis parallel to a holding surface 76 of a chuck table 75 that holds the wafer 10 as a target to be ground. The cutting blade 71 is mounted on a distal end of the spindle 72. The cutting blade 71 includes grindstones in at least a grinding surface or an outer circumferential surface thereof.

In the first example of the removing step ST42, as illustrated in FIG. 14, the reverse side 19 of the wafer 10 is held under suction on the holding surface 76 of the chuck table 75 with the protective member 31 interposed between the reverse side 19 and the holding surface 76. The way in which the wafer 10 is held on the holding surface 76 is the same as the way it is held in the first or third example of the ring-shaped stiffener separating step ST41, and will not be described below. The chuck table 75 may be shared as the chuck table 55 or 65 in the ring-shaped stiffener separating step ST41. It is thus preferable, though not necessary according to the present invention, to carry out the removing step ST42 while the wafer 10 with the device region 15 and the ring-shaped stiffener 21 separated from each other is being held on the chuck table 55 or 65.

In the first example of the removing step ST42, next, the cutting unit 70 and the wafer 10 are positioned with respect to each other. Specifically, the cutting blade 71 has its grinding surface positioned radially outwardly of the ring-shaped stiffener 21 of the wafer 10. In the first example of the removing step ST42, then, while the chuck table 75 is being rotated about its central axis, the spindle 72 is rotated to rotate the cutting blade 71 about its central axis. Next, while a processing fluid is being supplied to the ring-shaped stiffener 21 of the wafer 10 and the cutting blade 71, the cutting blade 71 is moved toward the central axis of the chuck table 75 and pressed against the outer circumferential edge of the wafer 10 rotating with the chuck table 75, thereby grinding the wafer 10. In the first example of the removing step ST42, the ring-shaped stiffener 21 is removed progressively from the outer circumferential edge of the wafer 10 toward its center. At this time, a control apparatus of the cutting unit 70 or an operator thereof controls the cutting blade 71 to stay out of contact with the annular cut groove, the laser-processed groove, or the modified layers formed in the ring-shaped stiffener separating step ST41. In this manner, the loads produced in the first example of the removing step ST42 are prevented from being transmitted through the wafer 10 to the device region 15. In the first example of the removing step ST42, the cutting blade 71 may grind off the entire thickness of the ring-shaped stiffener 21 in one stroke or may grind off fractions of the entire thickness of the ring-shaped stiffener 21 step by step in a plurality of strokes where the cutting blade 71 moves at respective different heights.

Figure 15:
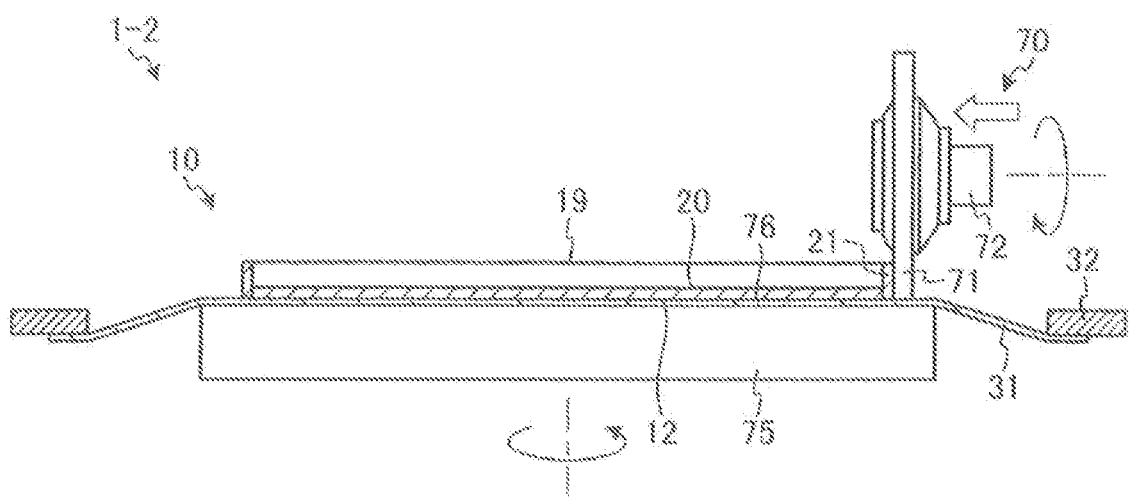
FIG. 15 is a side elevational view, partly in cross section, illustrating a second example of the removing step illustrated in FIG. 4.

FIG. 15 illustrates in side elevation, partly in cross section, the second example of the removing step ST42 illustrated in FIG. 4. The second example of the removing step ST42 illustrated in FIG. 15 is carried out after the second or fourth example of the ring-shaped stiffener separating step ST41. In other words, the second example of the removing step ST42 is carried out while the protective member 31 is being affixed to the face side 12 of the wafer 10.

In the second example of the removing step ST42, the cutting unit 70 grinds off the ring-shaped stiffener 21 that has been separated from the device region 15, as with the first example of the removing step ST42. In the second example of the removing step ST42, as illustrated in FIG. 15, the face side 12 of the wafer 10 is held under suction on the holding surface 76 of the chuck table 75 with the protective member 31 interposed between the face side 12 and the holding surface 76. The way in which the wafer 10 is held on the holding surface 76 is the same as the way it is held in the second or fourth example of the ring-shaped stiffener separating step ST41, and will not be described below. The chuck table 75 may be shared as the chuck table 55 or 65 in the ring-shaped stiffener separating step ST41, as with the first example of the removing step ST42. It is thus preferable, though not necessary according to the present invention, to carry out the removing step ST42 while the wafer 10 with the device region 15 and the ring-shaped stiffener 21 separated from each other is being held on the chuck table 55 or 65.

In the second example of the removing step ST42, next, the cutting unit 70 and the wafer 10 are positioned with respect to each other, and the ring-shaped stiffener 21 is ground off, i.e., removed by grinding. The way in which the cutting unit 70 and the wafer 10 are positioned with respect to each other, and the way in which the ring-shaped stiffener 21 is ground off are the same as the way in which the cutting unit 70 and the wafer 10 are positioned with respect to each other, and the way in which the ring-shaped stiffener 21 is ground off in the first example of the removing step ST42, and will not be described below in detail. In the second example of the removing step ST42, regardless of whether the face side 12 or the reverse side 19 of the wafer 10 is held on the holding surface 76 of the chuck table 75, the ring-shaped stiffener 21 is removed progressively from the outer circumferential edge of the wafer 10 toward its center. At this time, a control apparatus of the cutting unit 70 or an operator thereof controls the cutting blade 71 to stay out of contact with the annular cut groove, the laser-processed groove, or the modified layers formed in the ring-shaped stiffener separating step ST41. In this manner, the loads produced in the second example of the removing step ST42 are prevented from being transmitted through the wafer 10 to the device region 15. In the second example of the removing step ST42, the cutting blade 71 may grind off the entire thickness of the ring-shaped stiffener 21 in one stroke or may grind off fractions of the entire thickness of the ring-shaped stiffener 21 step by step in a plurality of strokes where the cutting blade 71 moves at respective different heights.

Figure 16:
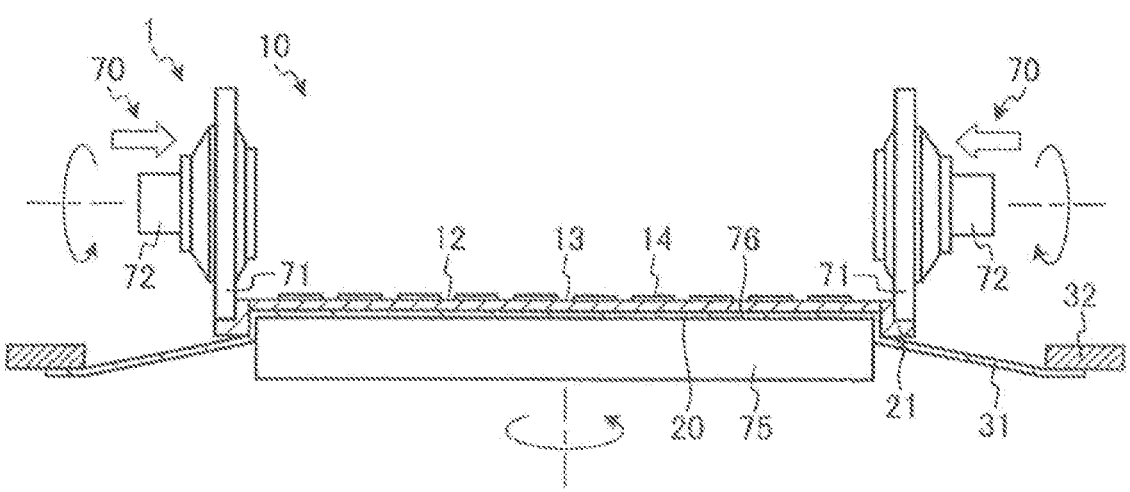
FIG. 16 is a side elevational view, partly in cross section, illustrating a third example of the removing step illustrated in FIG. 4.

FIG. 16 illustrates in side elevation, partly in cross section, the third example of the removing step ST42 illustrated in FIG. 4. The third example of the removing step ST42 illustrated in FIG. 16 is carried out after the first or third example of the ring-shaped stiffener separating step ST41. In other words, the third example of the removing step ST42 is carried out while the protective member 31 is being affixed to the reverse side 19 of the wafer 10.

In the third example of the removing step ST42, two cutting units 70 grind off the ring-shaped stiffener 21 that has been separated from the device region 15. In the third example of the removing step ST42, the two cutting units 70 are disposed such that their cutting blades 71 have their grinding surfaces facing each other. The two cutting units 70 simultaneously grind the outer circumferential edge of the wafer 10 from diametrically opposites sides thereof.

In the third example of the removing step ST42, the reverse side 19 of the wafer 10 is held under suction on the holding surface 76 of the chuck table 75 with the protective member 31 interposed between the reverse side 19 and the holding surface 76. Next, the cutting unit 70 and the wafer 10 are positioned with respect to each other, and the ring-shaped stiffener 21 is ground off. The way in which the cutting unit 70 and the wafer 10 are positioned with respect to each other, and the way in which the ring-shaped stiffener 21 is ground off are the same as the way in which the cutting unit 70 and the wafer 10 are positioned with respect to each other, and the way in which the ring-shaped stiffener 21 is ground off in the first example of the removing step ST42, and will not be described below in detail. In the second example of the removing step ST42 illustrated in FIG. 15, the ring-shaped stiffener 21 may also be ground off by two cutting units 70 that are disposed such that their cutting blades 71 have their grinding surfaces facing each other.

In the first, second, and third examples of the removing step ST42 illustrated respectively in FIGS. 14, 15, and 16, while the chuck table 75 is being rotated, the cutting blade 71 is caused to cut into the wafer 10 from the outer circumference toward the center thereof. However, the way in which the ring-shaped stiffener 21 is removed by the cutting blade 71 is not limited to the illustrated method. In the first, second, and third examples of the removing step ST42, as with the first and second examples of the ring-shaped stiffener separating step ST41, the cutting blade 71 may be caused to cut into the ring-shaped stiffener 21 from the upper surface thereof, and thereafter the chuck table 75 may be rotated. In this case, the cutting blade 71 may remove fractions of the ring-shaped stiffener 21 step by step in a plurality of strokes where the cutting blade 71 moves from the outer circumference toward the center of the wafer 10. In either one of the methods of removing the ring-shaped stiffener 21 with the cutting blade 71, a speed at which the chuck table 75 rotates and a speed at which the cutting blade 71 moves are selected to be appropriate conditions.

Figure 17:
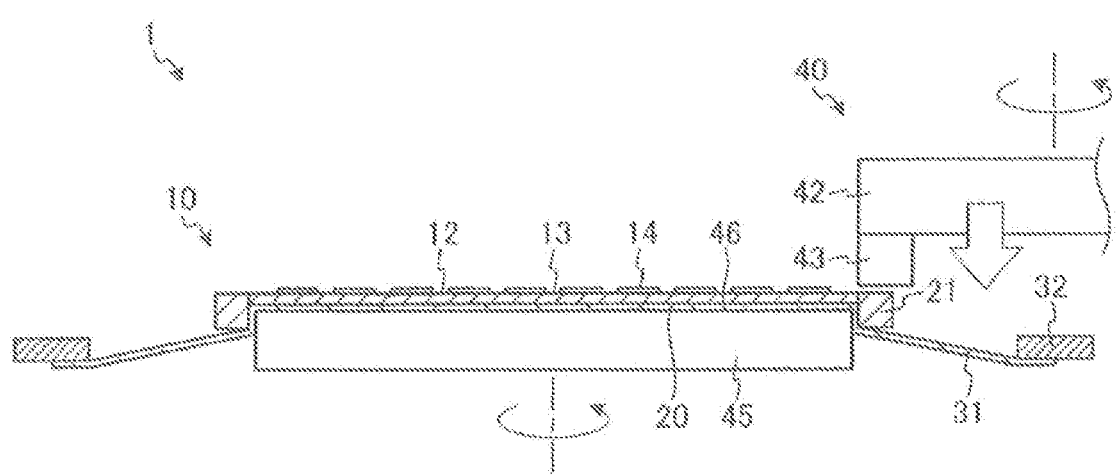
FIG. 17 is a side elevational view, partly in cross section, illustrating a fourth example of the removing step illustrated in FIG. 4.

FIG. 17 illustrates in side elevation, partly in cross section, the fourth example of the removing step ST42 illustrated in FIG. 4. The fourth example of the removing step ST42 illustrated in FIG. 17 is carried out after the first or third example of the ring-shaped stiffener separating step ST41. In other words, the fourth example of the removing step ST42 is carried out while the protective member 31 is being affixed to the reverse side 19 of the wafer 10.

In the fourth example of the removing step ST42, a grinding unit 40 grinds off the ring-shaped stiffener 21 that has been separated from the device region 15. The grinding unit 40 may be the same as or different from the grinding unit 40 used in the reverse side grinding step ST2. The grinding unit 40 used in the fourth example of the removing step ST42 includes a spindle 41 and a grinding wheel 42 attached to a lower end of the spindle 41, at least the spindle 41 and the grinding wheel 42 having a rotational shaft perpendicular to a holding surface 46 of a chuck table 45 that holds the wafer 10 as a target to be ground, or parallel to a central axis of the chuck table 45.

In the fourth example of the removing step ST42, as illustrated in FIG. 17, the reverse side 19 of the wafer 10 is held under suction on the holding surface 46 of the chuck table 45 with the protective member 31 interposed between the wafer 10 and the holding surface 46. The way in which the wafer 10 is held is the same as the way in which it is held in the first or third example of the removing step ST42, and will not be described below.

In the fourth example of the removing step ST42, next, the grinding unit 40 and the wafer 10 are positioned with respect to each other. Specifically, grindstones 43 mounted on a lower surface of the grinding wheel 42 are positioned above the face side 12 of the ring-shaped stiffener 21 of the wafer 10. At this time, the grindstones 43 are positioned such that outer circumferential edges thereof will not enter an area above the device region 15. In the fourth example of the removing step ST42, then, while the chuck table 45 is being rotated about its central axis, the spindle 41 rotates the grinding wheel 42 about its central axis. Next, while a processing fluid is being supplied to the ring-shaped stiffener 21 of the wafer 10 and the grindstones 43, the grinding wheel 42 is lowered to bring the rotating grindstones 43 into contact with the face side 12 of the ring-shaped stiffener 21 of the wafer 10 on the rotating chuck table 45. In the fourth example of the removing step ST42, the ring-shaped stiffener 21 is thus ground off from the face side 12 toward the reverse side 19. At this time, the control apparatus of the grinding unit 40 or the operator thereof controls the grindstones 43 to stay out of contact with the annular cut groove, the laser-processed groove, or the modified layers formed in the ring-shaped stiffener separating step ST41. In this manner, the loads produced in the fourth example of the removing step ST42 are prevented from being transmitted through the wafer 10 to the device region 15. In the fourth example of the removing step ST42, the grindstones 43 may grind off the entire width of the ring-shaped stiffener 21 in one stroke or may grind off fractions of the entire width of the ring-shaped stiffener 21 step by step in a plurality of strokes where the grindstones 43 move over respective different distances to the central axis of the chuck table 45.

Figure 18:
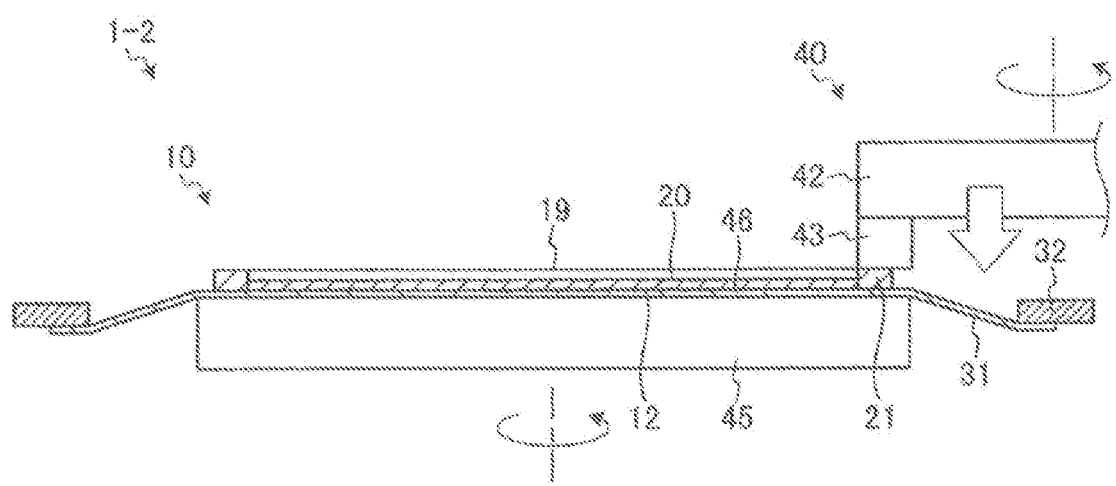
FIG. 18 is a side elevational view, partly in cross section, illustrating a fifth example of the removing step illustrated in FIG. 4.

FIG. 18 illustrates in side elevation, partly in cross section, the fifth example of the removing step ST42 illustrated in FIG. 4. The fifth example of the removing step ST42 illustrated in FIG. 18 is carried out after the second or fourth example of the ring-shaped stiffener separating step ST41. In other words, the fifth example of the removing step ST42 is carried out while the protective member 31 is being affixed to the face side 12 of the wafer 10.

In the fifth example of the removing step ST42, as with the fourth example of the removing step ST42, the grinding unit 40 grinds off the ring-shaped stiffener 21 that has been separated from the device region 15. In the fifth example of the removing step ST42, the face side 12 of the wafer 10 is held under suction on the holding surface 46 of the chuck table 45 with the protective member 31 interposed between the wafer 10 and the holding surface 46. The way in which the wafer 10 is held is the same as the way in which it is held in the second example of the removing step ST42, and will not be described below.

In the fifth example of the removing step ST42, next, the grinding unit 40 and the wafer 10 are positioned with respect to each other. Specifically, the grindstones 43 mounted on the lower surface of the grinding wheel 42 are positioned above the reverse side 19 of the ring-shaped stiffener 21 of the wafer 10. At this time, the grindstones 43 are positioned such that the outer circumferential edges thereof will not enter the area above the device region 15. In the fifth example of the removing step ST42, then, while the chuck table 45 is being rotated about its central axis, the spindle 41 rotates the grinding wheel 42 about its central axis. Next, while a processing fluid is being supplied to the ring-shaped stiffener 21 of the wafer 10 and the grindstones 43, the grinding wheel 42 is lowered to bring the rotating grindstones 43 into contact with the reverse side 19 of the ring-shaped stiffener 21 of the wafer 10 on the rotating chuck table 45. In the fifth example of the removing step ST42, the grindstones 43 thus grind the ring-shaped stiffener 21 from the reverse side 19 toward the face side 12, partly removing the ring-shaped stiffener 21 to a thickness that is the same as the thickness of the device region 15 or fully removing the ring-shaped stiffener 21. At this time, the control apparatus of the grinding unit 40 or the operator thereof controls the grindstones 43 to stay out of contact with the annular cut groove, the laser-processed groove, or the modified layers formed in the ring-shaped stiffener separating step ST41. In this manner, the loads produced in the fifth example of the removing step ST42 are prevented from being transmitted through the wafer 10 to the device region 15. In the fifth example of the removing step ST42, the grindstones 43 may grind off the entire width of the ring-shaped stiffener 21 in one stroke or may grind off fractions of the entire width of the ring-shaped stiffener 21 step by step in a plurality of strokes where the grindstones 43 move over respective different distances to the central axis of the chuck table 45.

The first and fourth examples of the removing step ST42 illustrated in FIGS. 14 and 17 are carried out while the protective member 31 is being affixed to the reverse side 19 of the wafer 10 and the face side 12 of the wafer 10 is facing upwardly. This method is advantageous in that after the ring-shaped stiffener 21 has been removed, the protective member 31 does not need to be reaffixed, and the wafer 10 can be divided into device chips by dicing or the like without changing its orientation.

On the other hand, the second and fifth examples of the removing step ST42 illustrated in FIGS. 15 and 18 are carried out while the protective member 31 is being affixed to the face side 12 of the wafer 10 and the reverse side 19 of the wafer 10 is facing upwardly. This method is advantageous in that the wafer 10 can easily be held on the chuck table 75 or 45, and since the protective member 31 is affixed to the face side 12 of the wafer 10, swarf or debris produced in the removing step ST42 is prevented from being applied to the surfaces of the devices 14.

As described above, in the method of processing the wafer 10 according to the present embodiment, after the region corresponding to the device region 15 and the ring-shaped stiffener 21 have been separated, the separated ring-shaped stiffener 21 is ground off, i.e., removed by grinding. As the separated ring-shaped stiffener 21 is removed by grinding, it is not necessary to carry out a difficult step, which requires a delicate operation, of detaching the ring-shaped stiffener 21 from the protective member 31 and delivering the wafer 10. It is not time-consuming to remove the ring-shaped stiffener 21, and the devices 14 are prevented from being damaged by the ring-shaped stiffener 21 as the ring-shaped stiffener 21 is not accidentally broken. Furthermore, inasmuch as the ring-shaped stiffener 21 is ground after it has been separated from the device region 15, the loads produced when the ring-shaped stiffener 21 is ground are not transmitted to the device region 15. Accordingly, the device region 15 is prevented from being chipped or cracked by the loads produced when the ring-shaped stiffener 21 is ground.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a wafer having on a face side thereof a device region in which a plurality of devices are formed in respective areas demarcated by a plurality of intersecting streets and an outer circumferential excess region surrounding the device region, the wafer further including a circular recess defined by grinding in a reverse side of the wafer and corresponding to the device region and a ring-shaped stiffener along an outer circumference of the circular recess, the method comprising:

a protective member affixing step of affixing a protective member whose area covers the face side or the reverse side of the wafer to the wafer; and after the protective member affixing step has been carried out, a ring-shaped stiffener removing step of removing the ring-shaped stiffener from the wafer, wherein the ring-shaped stiffener removing step includes:

a ring-shaped stiffener separating step of dividing the wafer along an outer circumference of the device region to separate the device region and the ring-shaped stiffener from each other, and after the ring-shaped stiffener separating step has been carried out, a removing step of processing the ring-shaped stiffener with a grindstone to remove the ring-shaped stiffener from the wafer while a processing fluid is being supplied to the wafer.

2. The method of processing a wafer according to claim 1, wherein the removing step includes a step of grinding off the ring-shaped stiffener with a grinding wheel mounted on a lower end of a spindle having a rotational axis perpendicular to a holding surface of a chuck table that holds the wafer thereon.

3. The method of processing a wafer according to claim 1, wherein the removing step includes a step of cutting off the ring-shaped stiffener with a cutting blade mounted on a distal end of a spindle having a rotational axis parallel to a holding surface of a chuck table that holds the wafer thereon.

4. The method of processing a wafer according to claim 1, wherein the ring-shaped stiffener separating step is carried out using a cutting blade or a laser beam.

5. The method of processing a wafer according to claim 1, wherein the protective member affixing step includes a step of affixing an outer circumferential edge of the protective member that covers the face side or the reverse side of the wafer to an annular frame, forming a frame unit in which the wafer is affixed to the protective member in an opening of the annular frame.

* * * * *